(12) United States Patent
Qureshi

(10) Patent No.: US 9,768,736 B2
(45) Date of Patent: Sep. 19, 2017

(54) POWER AMPLIFIER CELL

(71) Applicant: Ampleon Netherlands B.V., Nijmegen (NL)

(72) Inventor: Jawad Hussain Qureshi, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 15/267,904

(22) Filed: Sep. 16, 2016

(65) Prior Publication Data

US 2017/0077873 A1  Mar. 16, 2017

(30) Foreign Application Priority Data

Sep. 16, 2015 (EP) .................................. 15185534

(51) Int. Cl.
| | |
|---|---|
| H03F 1/02 | (2006.01) |
| H03F 1/56 | (2006.01) |
| H03F 3/213 | (2006.01) |
| H03F 3/195 | (2006.01) |
| H03F 3/26 | (2006.01) |
| H03F 3/60 | (2006.01) |
| H03H 7/38 | (2006.01) |
| H03H 7/42 | (2006.01) |

(52) U.S. Cl.
CPC ............ *H03F 1/0288* (2013.01); *H03F 1/56* (2013.01); *H03F 3/195* (2013.01); *H03F 3/213* (2013.01); *H03F 3/265* (2013.01); *H03F 3/604* (2013.01); *H03H 7/383* (2013.01); *H03H 7/422* (2013.01); *H03F 2200/06* (2013.01); *H03F 2200/09* (2013.01); *H03F 2200/423* (2013.01); *H03F 2200/451* (2013.01); *H03F 2200/541* (2013.01)

(58) Field of Classification Search
CPC ................................ H03F 1/0288; H03F 1/07
USPC ............................................... 330/295, 124 R
See application file for complete search history.

(56) References Cited

U.S. PATENT DOCUMENTS 5,357,213 A    10/1994 Michel et al.
6,133,788 A *  10/2000 Dent ..................... H03F 1/0294
                                                  330/124 R (Continued)

FOREIGN PATENT DOCUMENTS

EP        2899803 A1    7/2015

OTHER PUBLICATIONS

Chongcheawchamnan et al., "A Push-Pull Power Amplifier Using Novel Impedence Transforming Baluns," Proceedings of the 30th European Microwave Conference, Paris, Oct. 3-5, 2000; [Proceedings of the European Microwave Conference], London, Oct. 4, 2000, pp. 337-340.

(Continued)

*Primary Examiner* — Henry Choe
(74) *Attorney, Agent, or Firm* — McDonnell Boehnen Hulbert & Berghoff LLP

(57) ABSTRACT

A power amplifier cell (401) comprising: a first power amplifier (410), a second power amplifier (416) and a balun (422). The balun (422) comprising: a first transmission line (430); a second transmission line (432); a third transmission line (434); a fourth transmission line (436); and a biasing circuit (438) connected between (i) a reference terminal, and (ii) a second end of the second transmission line and a second end of the fourth transmission line.

16 Claims, 4 Drawing Sheets

(56) References Cited

U.S. PATENT DOCUMENTS

| | | | |
|---|---|---|---|
| 6,311,046 B1* | 10/2001 | Dent | H03F 1/0205 |
| | | | 455/102 |
| 8,482,353 B2* | 7/2013 | Blednov | H03F 1/0288 |
| | | | 330/124 R |
| 8,576,010 B2* | 11/2013 | Yanduru | H03F 1/0288 |
| | | | 330/124 R |
| 2006/0284698 A1 | 12/2006 | Vaisanen | |
| 2010/0148877 A1* | 6/2010 | Oakley | H03F 1/0288 |
| | | | 330/295 |

OTHER PUBLICATIONS

European Search Report issued in co-pending European Patent Application No. EP15185534, European Patent Office, dated Mar. 17, 2016, 9 pages.

\* cited by examiner

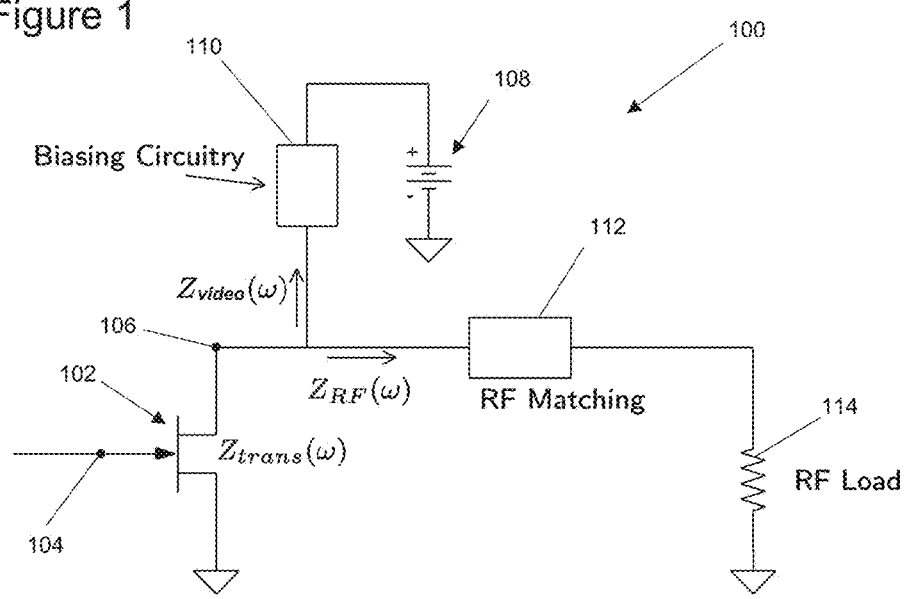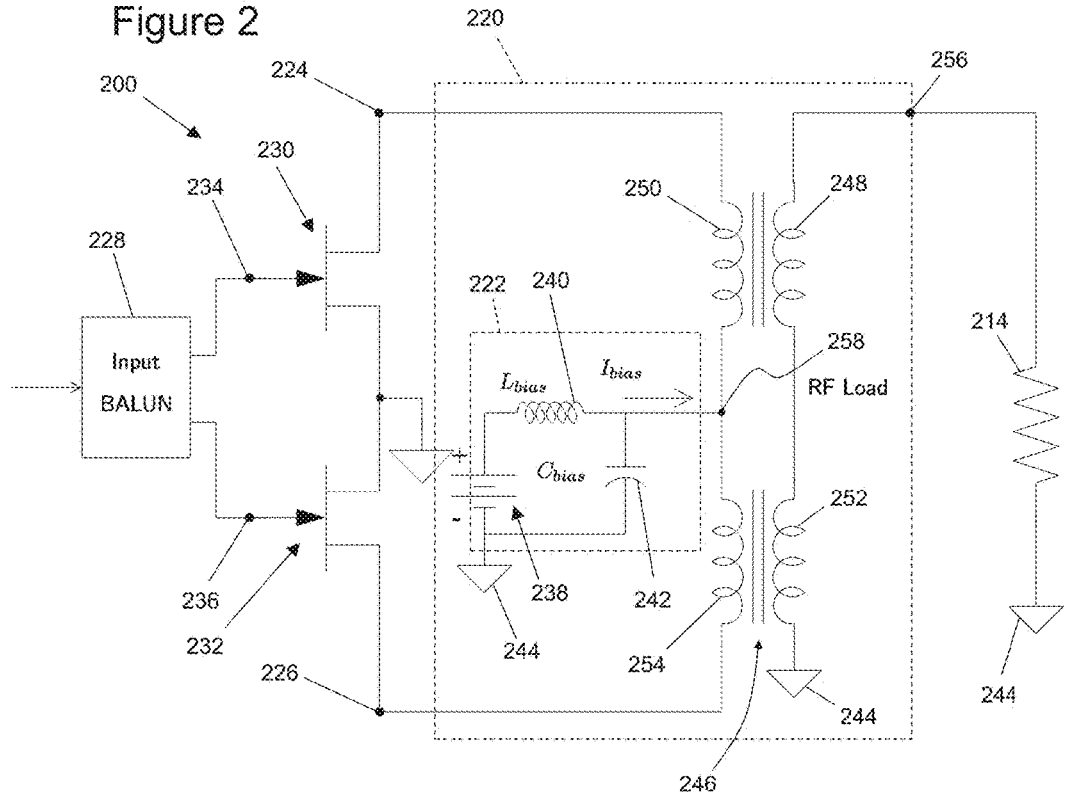

POWER AMPLIFIER CELL

CROSS-REFERENCE TO RELATED APPLICATIONS

This application claims priority to European Patent Application No. 15185534.3 filed on Sep. 16, 2015, the contents of which are incorporated entirely herein by reference.

FIELD

The present disclosure relates to power amplifier cells, and Doherty amplifiers including power amplifier cells.

SUMMARY

According to a first aspect of the present disclosure there is provided a power amplifier cell comprising:
  a first input terminal configured to receive a first-balanced-input-signal;
  a second input terminal configured to receive a second-balanced-input-signal;
  an output terminal;
  a reference terminal;
  a first power amplifier having:
    a first-PA-input-terminal connected to the first input terminal; and
    a first-PA-output-terminal;
  a second power amplifier having:
    a second-PA-input-terminal connected to the second input terminal; and
    a second-PA-output-terminal;
  a balun comprising:
    a first balanced node connected to the first-PA-output-terminal;
    a second balanced node connected to the second-PA-output-terminal;
    an unbalanced node connected to the output terminal;
    a first transmission line with a first end and a second end, the second end of the first transmission line connected to the unbalanced node;
    a second transmission line with a first end and a second end, wherein the second transmission line is capacitively and/or inductively coupled to the first transmission line, the first end of the second transmission line is connected to the first balanced node, and the second end of the second transmission line is connected to the reference terminal;
    a third transmission line with a first end and a second end, wherein the first end of the third transmission line is connected to the first end of the first transmission line, and the second end of the third transmission line is connected to the reference terminal;
    a fourth transmission line with a first end and a second end, wherein the first end of the fourth transmission line is connected to the second balanced node, the fourth transmission line is capacitively and/or inductively coupled to the third transmission line, and the second end of the fourth transmission line is connected to the reference terminal; and
  a biasing circuit connected between (i) the reference terminal, and (ii) the second end of the second transmission line and the second end of the fourth transmission line.

In one or more embodiments, the balun further comprises a tuning component connected between the first balanced node and the second balanced node;

the first power amplifier has an associated first-PA-output-capacitance;
the second power amplifier has an associated second-PA-output-capacitance, and
the value of the combined impedance of:
  (i) the first-PA-output-capacitance,
  (ii) the second-PA-output-capacitance, and
  (iii) the tuning component,
is configured for operation at a desired frequency band.

In one or more embodiments, each of the first power amplifier and the second power amplifier have an optimum load parameter (Ropt); and (a) the impedance between the first balanced node and the second balanced node of the balun (Zdiff), equals (b) the impedance between the unbalanced node of the balun and the reference terminal (Zsingle), and also equals (c) two times the optimum load parameter (Ropt).

In one or more embodiments, the biasing circuit comprises a bias-voltage-source. The biasing circuit may comprise the bias-voltage-source and a bias-capacitor connected in parallel with each other between: (i) the reference terminal, and (ii) the second end of the second transmission line and the second end of the fourth transmission line.

In one or more embodiments, the second end of the second transmission line is connected to the reference terminal via a first RF decoupling capacitor.

In one or more embodiments, the second end of the fourth transmission line is connected to the reference terminal via a second RF decoupling capacitor.

In one or more embodiments, the first power amplifier and the second power amplifier comprise field effect transistors, and in some embodiments comprise laterally diffused metal oxide semiconductor field effect transistors.

In one or more embodiments, the power amplifier cell comprises:
  a first-bondwire-inductance connected in series between the first-PA-output-terminal and the first balanced node; and
  a second-bondwire-inductance connected in series between the second-PA-output-terminal and the second balanced node.

In one or more embodiments, the balun comprises a planar balun or a Marchand balun.

There may be provided a power amplifier circuit comprising:
  any power amplifier cell disclosed herein;
  an input balun having an unbalanced-input-terminal, a balanced-first-output-terminal, and a balanced-second-output-terminal;
wherein first-input-balun-input-terminal is configured to receive an unbalanced input signal, the balanced-first-output-terminal is configured to provide a signal for the first input terminal of the power amplifier cell, and the balanced-second-output-terminal is configured to provide a signal for the second input terminal of the power amplifier cell.

In one or more embodiments, the power amplifier circuit further comprises:
  a first-wideband-input-matching-circuit; and
  a second-wideband-input-matching-circuit.

In one or more embodiments, the balanced-first-output-terminal is connected to an input terminal of the first-wideband-input-matching-circuit, and an output terminal of the first-wideband-input-matching-circuit is connected to the first input terminal of the power amplifier cell. The balanced-second-output-terminal may be connected to an input terminal of the second-wideband-input-matching-circuit, and an output terminal of the second-wideband-inputmatching-circuit may be connected to the second input terminal of the power amplifier cell.

There may be provided a Doherty amplifier comprising:
a Doherty-amplifier-output-terminal;
a main power amplifier cell comprising the power amplifier cell of any preceding embodiments, the main power amplifier cell comprising: a main-PA-first-input-terminal, a main-PA-second-input-terminal, and a main-PA-output-terminal;
wherein the main-PA-output-terminal is connected to the Doherty-amplifier-output-terminal through a main-transmission-line;
a peak power amplifier cell comprising the power amplifier cell of any preceding embodiments, the peak power amplifier cell comprising: a peak-PA-first-input-terminal, a peak-PA-second-input-terminal, and a peak-PA-output-terminal;
wherein the peak-PA-output-terminal is connected to the Doherty-amplifier-output-terminal through the series connection of (i) a peak-transmission-line and (ii) a compensating-transmission-line.

There may be provided an integrated circuit comprising any power amplifier cell, power amplifier circuit, or Doherty amplifier disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future claim sets. The Figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which:

FIG. 1 illustrates a power amplifier circuit;
FIG. 2 illustrates a power amplifier circuit that includes a balun.

DETAILED DESCRIPTION

Figure 3:
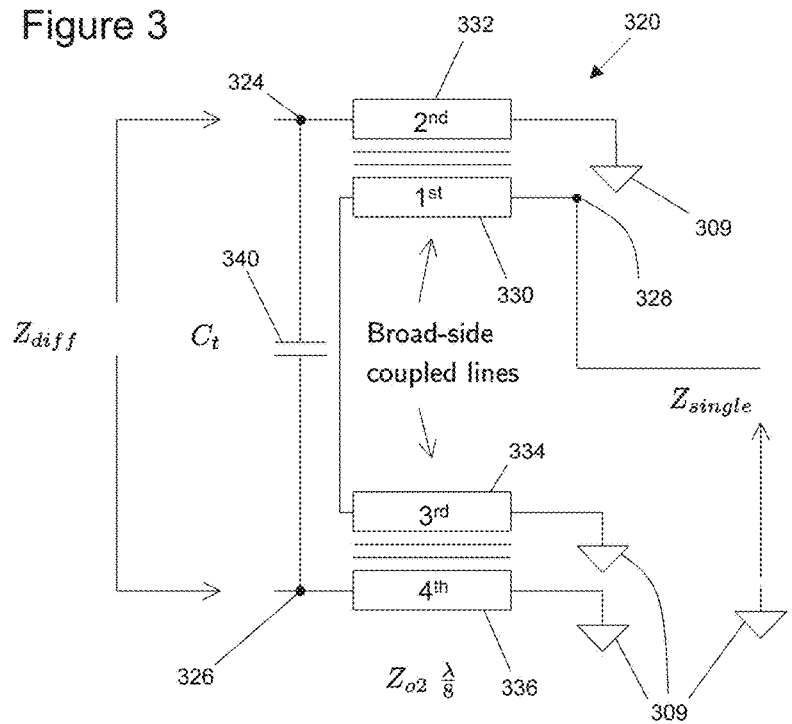
FIG. 3 illustrates a wideband planar balun.

Future mobile communication systems (for example 5G) can require very wide radio frequency (RF) bandwidth as well as very wide video bandwidth, whilst retaining high efficiency. Moreover, it is also currently desirable to have carrier aggregation on a single power amplifier (PA). These applications can require power amplifiers which are capable of providing very wideband RF as well as video bandwidth along-with high average efficiency.

FIG. 1 illustrates a power amplifier (PA) circuit 100 that includes a PA 102. FIG. 1 will be used to describe the influence of RF and video impedances on the wideband performance of the PA 102.

The PA 102 has an input terminal 104 and an output terminal 106. The input terminal 104 receives a modulated input signal. The output terminal 106 is connected to an RF load 114 through an RF matching circuit 112. The RF impedance is denoted by $Z_{RF}(w)$, which corresponds to the series impedance of the RF load 114 and the RF matching circuit 112. The RF bandwidth can be defined by the way the PA 102 works over the desired frequency band in terms of output power, gain and efficiency.

The output terminal 106 is also connected to a bias-voltage-source 108 through biasing circuitry 110. The current drawn from the bias-voltage-source 108 through the biasing circuitry 110 will vary with the magnitude of a modulated output signal at the output terminal of the PA 102. The impedance of the biasing circuitry 110 is denoted by $Z_{video}(w)$. As is known in the art, the biasing circuitry and biasing signals can also be referred to as video circuitry and video signals.

The video bandwidth can be defined by resonances in the video band of signals, the magnitude of the impedance of the biasing circuitry (which can also be referred to as video leads or a biasing inductor $Z_{video}(w)$, and a frequency response of the phase of baseband impedance.

As can be seen from FIG. 1, the RF signals (flowing through the RF matching circuit 112 and the RF load 114) and the video signals (flowing through the biasing circuitry 110) share the same circuitry and therefore interact with each other heavily. The impedance seen by the PA device 100 is given by the following equation:

$$Z_{trans}(\omega)=Z_{video}(\omega)\|Z_{RF}(\omega)$$

The impedance of the biasing circuitry 110 (which is also referred to as lead impedance), $Z_{video}(w)$, has conflicting requirements in relation to the RF bandwidth and the video bandwidth. For example, if the PA circuit 100 should be wideband at RF frequencies, it is important that the biasing path impedance ($Z_{video}(\omega)$) should be as high as possible in the RF pass-band frequencies. However, for the PA 100 to be wideband for video frequencies, the impedance seen by the transistors at video frequencies ($Z_{trans}(\omega)$@video frequencies) should be quite low. Also, transistor impedance seen at video frequencies should be imaginary. This means that $Z_{RF}(\omega)$ should be high as compared to $Z_{video}(\omega)$ at video frequencies.

Since the video signals and RF signals share the same path in FIG. 1 it can be very difficult to isolate them, especially for very wideband amplifiers. For example if the PA 102 is operating at 1.8 GHz, and the desired video bandwidth is close to 900 Mhz, then the biasing circuitry 110 (also referred to as biasing leads) should present low impedance from 0 to 900 Mhz signals and high impedance to 1.4-2.2 GHz signals. This can be difficult to implement/realize.

One or more of the following problems can arise when power amplifiers are designed for very wideband (both in terms of video & RF) bandwidth.
1) The RF and video bandwidth have conflicting requirements on the biasing circuitry 110. The wide video bandwidth requires it to be smaller, while for obtaining wide RF bandwidth it should be higher. This may not be possible to overcome by the redesign of the output network.
2) The RF circuitry is visible to the biasing circuitry 110, which can cause phase change of the video impedance at higher video frequencies, which in turn can pose problems for a digital pre-distortor (not shown in FIG. 1).

3) It can be difficult to compensate output capacitance (of the PA device 100) for very wideband bandwidth, especially for high efficiency PA concepts.

The nature of RF and video signals in a class-B RF power amplifier will now be described.

The RF signal is the actual signal at the output terminal of the PA, while the video signal is the signal that is a result current drawn by the class-B PA from the video leads (biasing circuitry). The level of the current in the video leads is dependent on the amplitude of the RF power.

Now if we consider a differential topology and look at the nature of the video and RF signals at the device lead of a differential pair, we can determine that the RF signal is a differential (or odd-mode) signal, while the video signal is a common mode signal (because it depends on the magnitude of the RF power). Therefore, if a BALUN (balanced to unbalance convertor) type of device is used, the two type of signals can be separated from each other and terminated separately.

FIG. 2 illustrates a power amplifier (PA) circuit 200 that includes a balun 220 for separating the video and RF signals.

The PA circuit 200 has an input balun 228 that receives an unbalanced input signal, and provides two unbalanced signals that are provided as inputs to a first PA 230 and a second PA 236. The first PA 230 has a first-PA-input-terminal 234 that receives a first-balanced-input-signal from the input balun 228. The first PA 230 also has a first-PA-output-terminal 224. The second PA 232 has a second-PA-input-terminal 236 that receives a second-balanced-input-signal from the input balun 228. The second PA 230 also has a second-PA-output-terminal 226.

The balun 220 in this example includes a transformer that has a four windings: a second winding 250 and a fourth winding 254 on a primary side of the transformer 246, and a first winding 248 and a third winding 252 on the secondary side of the transformer 246. The second winding 250 and the fourth winding 254 are connected in series with each other between the first-PA-output-terminal 224 and the second-PA-output-terminal 226. A bias-node 258 is defined as the node between the series connection of the second winding 250 and the fourth winding 254.

The second winding 250 is magnetically coupled to the first winding 248. The fourth winding 254 is magnetically coupled to the third winding 252. The first winding 248 and the third winding 252 are connected in series between a reference terminal 244 (such as ground) and an unbalanced output terminal/node 256 of the balun 220. The unbalanced output terminal/node 256 of the balun 220 is connected to an RF load 214.

The balun 220 also includes a biasing circuit 222 connected between the reference terminal 244 and the bias-node 258. The biasing circuit 222 provides a biasing current $I_{bias}$ to the balun 220. In this example, the biasing circuit 222 includes a bias-inductor 240 a bias-capacitor 242 and a bias-voltage-source 238. The bias-voltage-source 238 and the bias-inductor 240 are connected in series between the bias-node 258 and the reference terminal 244. The bias-capacitor 242 is also connected between the bias-node 258 and the reference terminal 244, such that it is in parallel with the bias-voltage-source 238 and the bias-inductor 240.

In FIG. 2, the RF circuit is invisible to the video path and therefore any phase change of the video impedance at higher video frequencies, and any related problems for a digital pre-distortor, can be reduced. Furthermore, if the coupling of the transformer 246 can be increased, then the video inductance for each path can be reduced/minimised.

The circuit of the FIG. 2 uses a transformer, which can be difficult to implement in planar PCB technology. Also, the transformer may not provide a convenient way of compensating the output capacitance of the first and second PA devices 230, 232. The wideband (RF) operation of the first and second PA devices 230, 232 can be improved if the output capacitance is compensated in a wideband fashion before combining the signals in the balun 220.

Furthermore, if the PA devices 230, 232 are to be used in an advanced PA architecture such as wideband Doherty circuits, then it can be important to compensate that capacitance with a minimum delay such that total delay after the balun does not exceed 90 degrees.

FIG. 3 shows a wideband planar balun 320, which has been found to be suitable for output capacitance compensation of PA devices. The planar balun 320 in this example is derived from a Marchand balun. This type of balun can be operated at 50 ohm impedance level, and can also be designed with some impedance transformation, for example 12.5 ohm differential to 50 ohm single ended, and can show a fractional bandwidth between 30-40%.

The balun 320 shown in FIG. 3 has a first differential/unbalanced node 324, a second differential/unbalanced node 326, a single-ended/balanced node 328 and a reference terminal 309 such as ground. The balun also has two broadside-coupled lines, along with a tuning capacitor 340 at the differential end.

A first set of broadside-coupled lines includes a first transmission line 330 and a second transmission line 332. The first transmission line 330 has a first end and a second end. The second end of the first transmission line is 330 connected to the unbalanced node 328. The second transmission line 332 also has a first end and a second end. The second transmission line 332 is capacitively and/or inductively coupled to the first transmission line 330. The first end of the second transmission line 332 is connected to the first balanced node 324. The second end of the second transmission line 332 is connected to the reference terminal 309.

A second set of broadside-coupled lines includes a third transmission line 334 and a fourth transmission line 336. The third transmission line 334 has a first end and a second end. The first end of the third transmission line 334 is connected to the first end of the first transmission line 330. The second end of the third transmission line 334 is connected to the reference terminal 309. The fourth transmission line 336 also has a first end and a second end. The first end of the fourth transmission line 336 is connected to the second balanced node 326. The fourth transmission line 336 is capacitively and/or inductively coupled to the third transmission line 334. The second end of the fourth transmission line 336 is connected to the reference terminal 309.

These type of BALUNs can be designed to be very wideband (showing reflection coefficient better than 25 dB for a fractional bandwidth of more 50%) if impedances at the differential and single ended sides are kept equal ($Z_{diff}=Z_{single}$). In one example, $Z_{diff}=50$ ohm case and $Z_{single}=50$ ohm. In this particular case, the balun 320 does not provide any impedance transformation and is equivalent to a 50 ohm transmission line in the pass band. Moreover, this balun can be designed at any impedance level by appropriately choosing the odd-mode impedances of the broadside-coupled lines.

Figure 4:
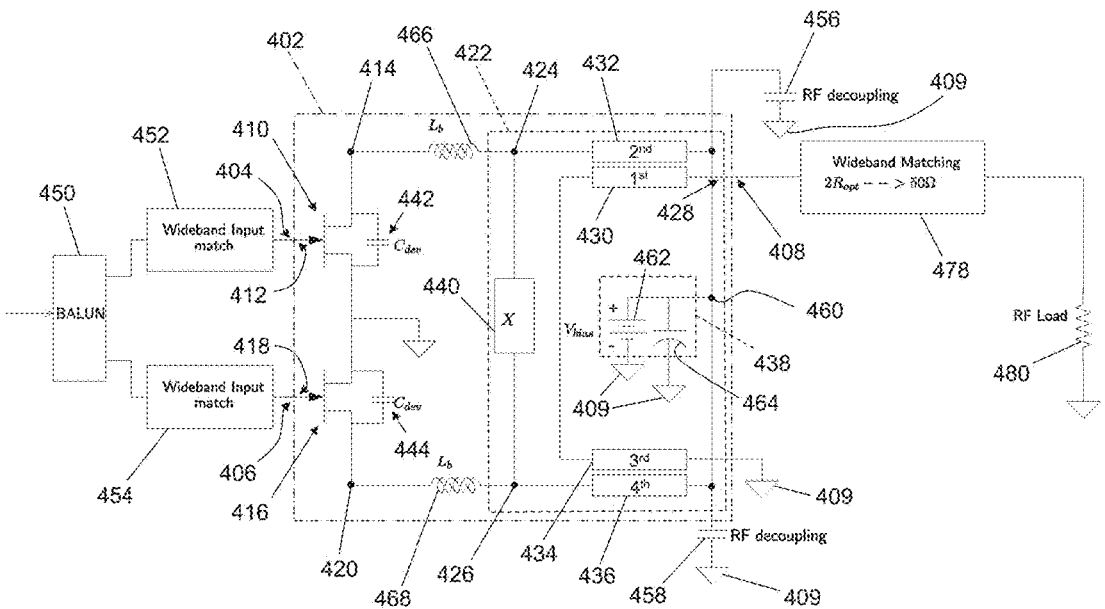
FIG. 4 shows an example embodiment of a wideband power amplifier cell.

FIG. 4 shows an example embodiment of a wideband power amplifier cell 402.

The power amplifier cell 402 includes a first input terminal 404 that can receive a first-balanced-input-signal, a second input terminal 406 that can receive a second-balanced-input-signal, an output terminal 408, and a reference terminal 409.

The output terminal 408 of the power amplifier cell 402 is connected to a wideband-output-matching-circuit 478, which in turn is connected to an RF load 480.

In this example, FIG. 4 also shows an input balun 450. The input balun 450 has an unbalanced-input-terminal, a balanced-first-output-terminal, and a balanced-second-output-terminal. The first-input-balun-input-terminal receives an unbalanced input signal. The balanced-first-output-terminal provides a signal for the first input terminal 404 of the power amplifier cell 402, and the balanced-second-output-terminal provides a signal for the second input terminal 406 of the power amplifier cell 402.

In this example, the balanced-first-output-terminal of the input balun 450 is connected to an input terminal of a first-wideband-input-matching-circuit 452. An output terminal of the first-wideband-input-matching-circuit 452 is connected to the first input terminal 404 of the power amplifier cell 402 to provide the first-balanced-input-signal. The balanced-second-output-terminal of the input balun 450 is connected to an input terminal of a second-wideband-input-matching-circuit 454. An output terminal of the second-wideband-input-matching-circuit 454 is connected to the second input terminal 406 of the power amplifier cell 402 to provide the second-balanced-input-signal.

The power amplifier cell 402 includes a first power amplifier 410 and a second power amplifier 416. The first power amplifier 410 has a first-PA-input-terminal 412 and a first-PA-output-terminal 414. The first-PA-input-terminal 412 is connected to the first input terminal 404. The first power amplifier 410 also has a first-PA-reference-terminal that is connected to the reference terminal 409.

The second power amplifier 416 has a second-PA-input-terminal 418 and a second-PA-output-terminal 420. The second-PA-input-terminal 418 is connected to the second input terminal 406. The second power amplifier 416 also has a second-PA-reference-terminal that is connected to the reference terminal 409.

In this example, each of the first power amplifier 410 and the second power amplifier 416 is implemented as a laterally diffused metal oxide semiconductor (LDMOS) field effect transistor (FET). In other examples, the first power amplifier 410 and the second power amplifier 416 can be any type of transistor.

The power amplifier cell 402 also includes a balun 422 that comprises a first balanced node 424, a second balanced node 426, and an unbalanced node 428. The first balanced node 424 is connected to the first-PA-output-terminal 414. The second balanced node 426 is connected to the second-PA-output-terminal 420. The unbalanced node 428 is connected to the output terminal 408.

The balun 422 also includes a first transmission line 430 and a second transmission line 432 that are capacitively and/or inductively coupled to each other. The first transmission line 430 has a first end and a second end. The second end of the first transmission line 430 is connected to the unbalanced node 428. The second transmission line 432 has a first end and a second end. The first end of the second transmission line is connected to the first balanced node 424. The second end of the second transmission line 432 is connected to the reference 409 terminal, in this example through an optional first-RF-decoupling-capacitor 456.

The balun 422 also includes a third transmission line 434 and a fourth transmission line 436 that are capacitively and/or inductively coupled to each other. The third transmission line 434 has a first end and a second end. The first end of the third transmission line 434 is connected to the first end of the first transmission line 430. The second end of the third transmission line 434 is connected to the reference terminal 409. The fourth transmission line 436 has a first end and a second end. The first end of the fourth transmission line 436 is connected to the second balanced node 426. The second end of the fourth transmission line 436 is connected to the reference terminal 409, in this example through an optional second-RF-decoupling-capacitor 458.

In this way, the first transmission line 430 and the third transmission line 434 are connected in series between the unbalanced node 428 (for connecting to the RF load) and the reference terminal 409. A bias-node 460 is defined as the node between the series connection of the first transmission line 430 and the third transmission line 434. The bias-node is connected to the second end of the second transmission line 432 and the second end of the fourth transmission line 436.

The balun also includes a biasing circuit 438 connected between (i) the reference terminal 409, and (ii) the bias-node 460. In this example, the biasing circuit 438 comprises a bias-voltage-source 462 and a bias-capacitor 464 connected in parallel with each other between the reference terminal 409 and the bias-node 460.

In the example of FIG. 4, the balun 422 also includes a tuning component 440 connected between the first balanced node 424 and the second balanced node 426. The tuning component 440, which may also be referred to as a shunt component, may be a capacitor or an inductor (depending on the technology of the PA devices 410, 416 and the frequency of operation). The tuning component 440 is used to tune the power amplifier cell 402 for adequate operation at a desired RF frequency.

As shown in FIG. 4, the first power amplifier 410 has an associated first-PA-output-capacitance (Cdev) 442 and the second power amplifier 416 has an associated second-PA-output-capacitance (Cdev) 444. The inclusion of the output capacitances represents a realistic/practical structure of an LDMOS device.

As will be described in more detail below, advantageously the value of the impedance of the tuning component 440 can be selected for operation at a desired frequency band. That is, the impedance value of the tuning component 440 can be selected/designed based on the impedance values of the first-PA-output-capacitance 442 and the second-PA-output-capacitance 444.

For wideband operation, the balun 422 can be designed at 2 times the base-impedance of the PA devices 410, 416, which is defined by the following equation.

$$R_{opt} = \frac{0.5(V_{drain} - V_{knee})^2}{P_{max}} \quad (1)$$

The impedance ($R_{opt}$) represented in equation (1) is the load required by the PA devices 410, 416 to deliver maximum power, assuming that the output capacitances (the first-PA-output-capacitance 442 and the second-PA-output-capacitance 444) of the PA devices 410, 416 is not present.

$$Z_{diff} = Z_{single} = 2R_{opt} \quad (2)$$

In this particular case (balun design criteria of equation (2)), some or all of the required tuning capacitance can be replaced by the output capacitances (the first-PA-output-capacitance 442 and the second-PA-output-capacitance 444) of the PA devices 410, 416. In this way, the output capacitances of the PA devices 410, 416 can be compensated in a very wideband fashion, whilst retaining wideband balun operation. This can enable the PA devices 410, 416 to present a substantially real impedance, or at least with a smaller imaginary component than would be present if the value of the combined impedance of (i) the first-PA-output-capacitance 442, (ii) the second-PA-output-capacitance 444, and (iii) the tuning component 440 were not used. This can also provide a good Q factor.

That is, each of the first power amplifier 410 and the second power amplifier 416 have an optimum load parameter ($R_{opt}$); and
(a) the impedance between the first balanced node 424 and the second balanced node 426 of the balun 422 ($Z_{diff}$), equals
(b) the impedance between the unbalanced node 428 of the balun 422 and the reference terminal 409 ($Z_{single}$), and also equals
(c) two times the optimum load parameter ($R_{opt}$) of the first power amplifier 410 and the second power amplifier 416.

Figure 5:
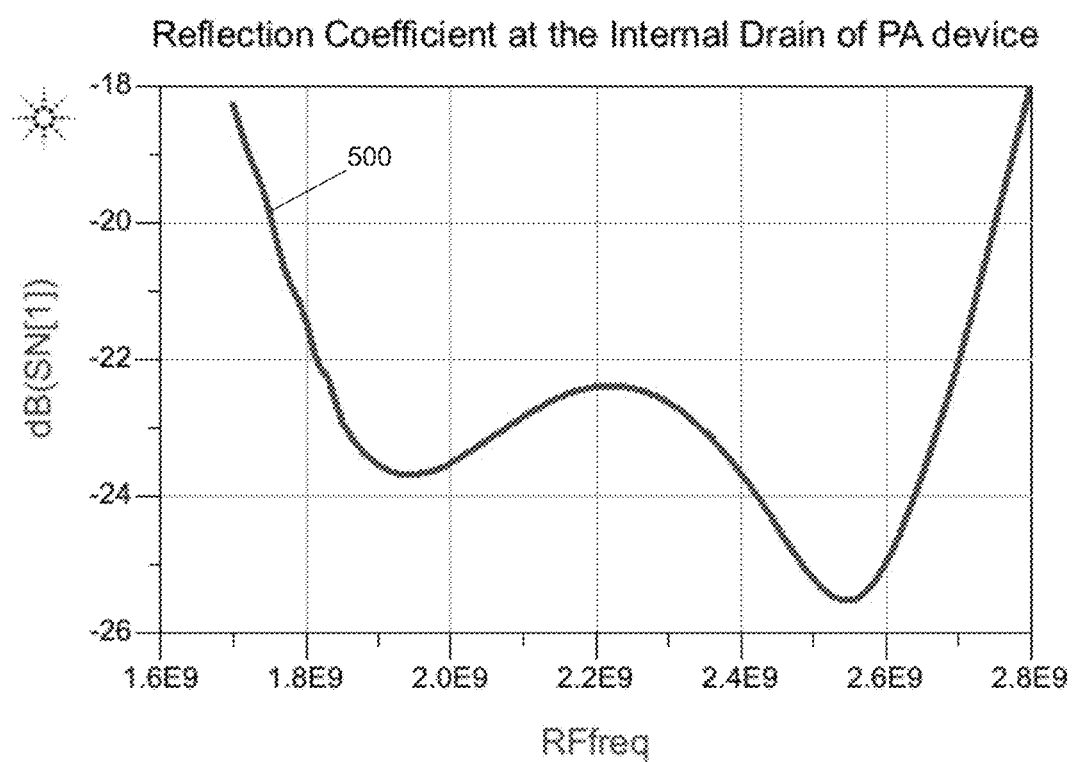
FIG. 5 illustrates an input reflection (dB) against frequency profile for the power amplifier cell of FIG. 4.

FIG. 5 illustrates an input reflection (dB) against frequency profile 500 for the power amplifier cell of FIG. 4. The reflection coefficient at the internal drain of the PA device for optimum load ($R_{opt}$) is shown. The profile 500 is shown over the frequency range of 1.6 to 2.8 GHz. For some applications, an input reflection of less than −20 dB may be required. The input reflection profile 500 is less than −20 dB between about 1.75 GHz and about 2.75 GHz, which can be considered as representing a device with acceptable performance across a very wide bandwidth.

It is evident from FIG. 5 that using the balun of FIG. 4, and using the output capacitance of the PA devices as (at least part of) the tuning capacitance for the balun results in a very wideband operation. Another important characteristic of this structure is that the grounded end of the balun can be used to feed DC bias currents to the drains of the PA devices, thereby providing a low impedance path for the video currents to flow into the PA devices.

Returning to FIG. 4, the power amplifier cell 402 in this example also shows a first-bondwire-inductance (Lb) 466 connected in series between the first-PA-output-terminal 414 and the first balanced node 424, and also a second-bondwire-inductance (Lb) 468 connected in series between the second-PA-output-terminal 420 and the second balanced node 426. The first-bondwire-inductance 466 and the second-bondwire-inductance 468 are used to connect the power amplifiers to the balun 422.

As discussed above, an advantage of the balun 422 is that it acts very much like a transmission line in the RF passband, and can therefore easily and conveniently be used to replace transmission line components in advanced wideband PA architectures such as ultra-wideband (UWB) Doherty amplifiers, thereby resulting in compact and wideband circuits. One such UWB Doherty made with this coupler is shown in FIG. 6.

Figure 6:
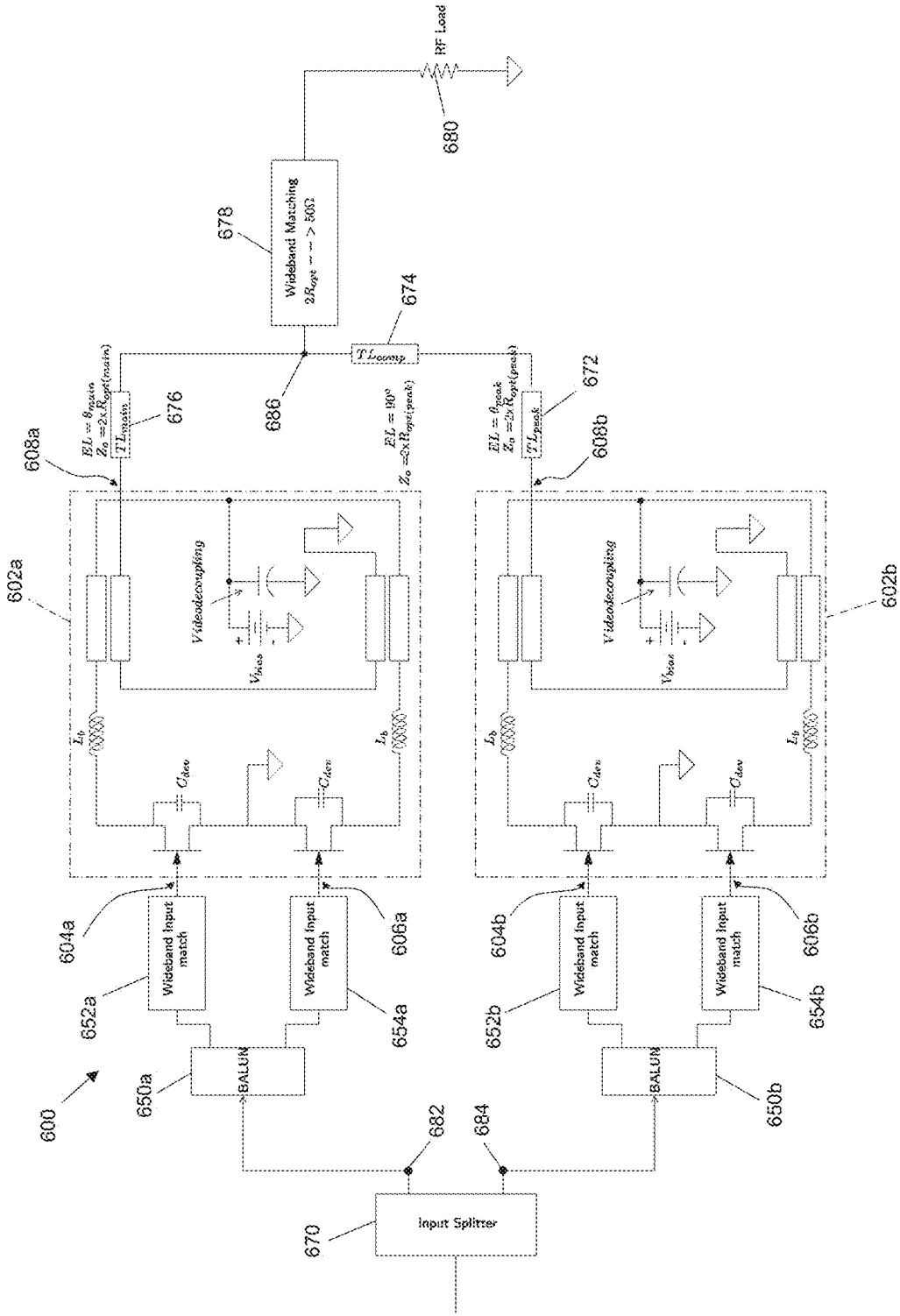
FIG. 6 shows an ultra-wideband Doherty power amplifier that uses two wideband power amplifier cells.

FIG. 6 shows an ultra-wideband Doherty PA 600 that uses two wideband PA cells 602a, 602b such as the one illustrated in FIG. 4. The Doherty amplifier has a Doherty-amplifier-output-terminal 686.

The Doherty PA 600 includes a main-PA-cell 602a, and a peak-PA-cell 602b. The main-wideband-PA-cell 602a includes a main-PA-first-input-terminal 604a, a main-PA-second-input-terminal 606a, and a main-PA-output-terminal 608a. The peak-wideband-PA-cell 602b includes a peak-PA-first-input-terminal 604b, a peak-PA-second-input-terminal 606b, and a peak-PA-output-terminal 608b.

The Doherty PA 600 also includes an input splitter 670 having a splitter-input-terminal, a splitter-main-output-terminal 682 and a splitter-peak-output-terminal 684. The input splitter 670 receives an input signal. The splitter-main-output-terminal 682 provides a main-split-signal. The splitter-peak-output-terminal 684 provides a peak-split-signal. A phase shifter (not shown) is placed separately in front of the main-PA-cell 602a in this example such that the main-split-signal is 90° out of phase with respect to the peak-split-signal.

The splitter-main-output-terminal 682 is connected to a main-unbalanced-input-terminal of a main-input-balun 650a. A main-balanced-first-output-terminal of the main-input-balun 650a is connected to an input terminal of a main-first-wideband-input-matching-circuit 652a. An output terminal of the main-first-wideband-input-matching-circuit 652a provides a main-first-balanced-input-signal to the main-PA-first-input-terminal 604a. A main-balanced-second-output-terminal of the main-input-balun 650a is connected to an input terminal of a main-second-wideband-input-matching-circuit 654a. An output terminal of the main-second-wideband-input-matching-circuit 654a provides a main-second-balanced-input-signal to the main-PA-second-input-terminal 606a.

The splitter-peak-output-terminal 684 is connected to a peak-unbalanced-input-terminal of a peak-input-balun 650b. A peak-balanced-first-output-terminal of the peak-input-balun 650b is connected to an input terminal of a peak-first-wideband-input-matching-circuit 652b. An output terminal of the peak-first-wideband-input-matching-circuit 652b provides a peak-first-balanced-input-signal to the peak-PA-first-input-terminal 604b. A peak-balanced-second-output-terminal of the peak-input-balun 650b is connected to an input terminal of a peak-second-wideband-input-matching-circuit 654b. An output terminal of the peak-second-wideband-input-matching-circuit 654b provides a peak-second-balanced-input-signal to the peak-PA-second-input-terminal 606b.

The main-PA-output-terminal 608a is connected to a first end of a main-transmission-line 676. A second end of the main-transmission-line 676 is connected to the Doherty-amplifier-output-terminal 686. The main-transmission-line 676 has an electrical length of $\theta_{main}$ such that total electrical length ($\theta_{main}$+phase delay of balun) equals 90° at the center frequency of the band, and has an impedance of $2 \times R_{opt(main)}$, ($R_{opt(main)}$ is the optimum impedance of the entire main-PA-cell 602a).

The peak-PA-output-terminal 608b is connected to a first end of a peak-transmission-line 672. A second end of the peak-transmission-line 672 is connected to a first end of a compensating-transmission-line 674. A second end of the compensating-transmission-line 674 is connected to the Doherty-amplifier-output-terminal 686. The peak-transmission-line 672 has an electrical length of $\theta_{peak}$ such that the total phase delay in-front of the peaking device ($\theta_{peak}$+phase delay of balun) equals 90°, and has an impedance of $2 \times R_{opt(peak)}$ ($R_{opt(peak)}$ is the optimum impedance of the entire peak-PA-cell 602b). The compensating-transmission-line 674 has an electrical length that provides a further 90° phase shift such that the output signal of the peak-PA-cell 602b is brought into phase with the output signal of the main-PA-cell 602a. The compensating-transmission-line 674 also has an impedance of $2\times R_{opt(peak)}$. The Doherty-amplifier-output-terminal 686 is connected to an input terminal of a wideband-output-matching-circuit 678, which in turn is connected to an RF load 680.

Using the wideband PA cells 602a, 602b in the Doherty amplifier of FIG. 6 can advantageously provide a very wideband Doherty amplifier. The wideband cells can be used in numerous applications, including wideband PA class-B amplifiers, out-phasing amplifiers, wideband Doherty amplifiers for all frequency bands, and 3-way and 4-way Doherty amplifiers.

The wideband PA cells of FIGS. 4 and 6 can enable a balun to be designed with a structure that has little or no impedance transformation, with an impedance that is approximately equal to two time the base-impedance of the PA device. Also, the output capacitance of the PA devices can be used to contribute to the tuning capacitance for the balun structure. Furthermore, the transmission line-type properties of the wideband PA cells can be beneficially used to form wideband Doherty Amplifiers.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled or connected may be coupled or connected either directly or indirectly. In the case of indirect coupling, additional components may be located between the two components that are said to be coupled or connected whilst still enabling the required functionality to be achieved.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:
1. A power amplifier cell comprising:
   a first input terminal configured to receive a first-balanced-input-signal;
   a second input terminal configured to receive a second-balanced-input-signal;
   an output terminal;
   a reference terminal;
   a first power amplifier having:
      a first-PA-input-terminal connected to the first input terminal; and
      a first-PA-output-terminal;
      the first power amplifier having an associated first-PA-output-capacitance;
   a second power amplifier having:
      a second-PA-input-terminal connected to the second input terminal; and
      a second-PA-output-terminal;
      the second power amplifier having an associated second-PA-output-capacitance;
   a balun comprising:
      a first balanced node connected to the first-PA-output-terminal;
      a second balanced node connected to the second-PA-output-terminal;
      an unbalanced node connected to the output terminal;
      a first transmission line with a first end and a second end, the second end of the first transmission line connected to the unbalanced node;
      a second transmission line with a first end and a second end, wherein the second transmission line is capacitively and/or inductively coupled to the first transmission line, the first end of the second transmission line is connected to the first balanced node, and the second end of the second transmission line is connected to the reference terminal;
      a third transmission line with a first end and a second end, wherein the first end of the third transmission line is connected to the first end of the first transmission line, and the second end of the third transmission line is connected to the reference terminal;
      a fourth transmission line with a first end and a second end, wherein the first end of the fourth transmission line is connected to the second balanced node, the fourth transmission line is capacitively and/or inductively coupled to the third transmission line, and the second end of the fourth transmission line is connected to the reference terminal; and
      a tuning component connected between the first balanced node and the second balanced node;

each of the first power amplifier and the second power amplifier being associated with a predefined load parameter (Ropt) corresponding to a desired substantially resistive load seen at the first-PA-output-terminal and the second-PA-output-terminal, respectively, at a predefined operational frequency assuming that the first-PA-output-capacitance and the second-PA-output-capacitance are not present;

the balun and the tuning component being designed such that:
an impedance between the first balanced node and the second balanced node of the balun (Zdiff), when said balun is terminated by a predefined impedance (Zsingle) connected in between the unbalanced node and the reference terminal, substantially equals said predefined impedance (Zsingle) at the operational frequency;
said impedance between the first balanced node and the second balanced node of the balun substantially equaling two times the predefined load parameter (Ropt); and
the balun being designed at substantially two times the predefined load parameter at the operational frequency;
said tuning component at least in large part being formed by the first-PA-output-capacitance and the second-PA-output-capacitance.

2. The power amplifier cell of claim 1, wherein the second end of the second transmission line is connected to the reference terminal via a first RF decoupling capacitor, and wherein the second end of the fourth transmission line is connected to the reference terminal via a second RF decoupling capacitor;
the power amplifier further comprising a biasing circuit connected between (i) the reference terminal, and (ii) the second end of the second transmission line and the second end of the fourth transmission line.

3. The power amplifier cell of claim 1, wherein the biasing circuit comprises a bias-voltage-source.

4. The power amplifier cell of claim 3, wherein the biasing circuit comprises the bias-voltage-source and a bias-capacitor connected in parallel with each other between: (i) the reference terminal, and (ii) the second end of the second transmission line and the second end of the fourth transmission line.

5. The power amplifier cell of claim 1, wherein the first power amplifier and the second power amplifier comprise field effect transistors.

6. The power amplifier cell of claim 1, further comprising:
a first-bondwire-inductance connected in series between the first-PA-output-terminal and the first balanced node; and
a second-bondwire-inductance connected in series between the second-PA-output-terminal and the second balanced node.

7. The power amplifier cell of claim 1, wherein the balun comprises a planar balun.

8. The power amplifier cell of claim 1, wherein the balun comprises a Marchand balun.

9. A power amplifier circuit comprising:
the power amplifier cell of claim 1;
an input balun having an unbalanced-input-terminal, a balanced-first-output-terminal, and a balanced-second-output-terminal;
wherein the unbalanced-input-terminal is configured to receive an unbalanced input signal, the balanced-first-output-terminal is configured to provide a signal for the first input terminal of the power amplifier cell, and the balanced-second-output-terminal is configured to provide a signal for the second input terminal of the power amplifier cell.

10. The power amplifier circuit of claim 9, further comprising:
a first-wideband-input-matching-circuit; and
a second-wideband-input-matching-circuit;
wherein:
the balanced-first-output-terminal is connected to an input terminal of the first-wideband-input-matching-circuit, and an output terminal of the first-wideband-input-matching-circuit is connected to the first input terminal of the power amplifier cell, and
the balanced-second-output-terminal is connected to an input terminal of the second-wideband-input-matching-circuit, and an output terminal of the second-wideband-input-matching-circuit is connected to the second input terminal of the power amplifier cell.

11. A Doherty amplifier comprising:
a Doherty-amplifier-output-terminal;
a main power amplifier cell comprising the power amplifier cell of claim 1, the main power amplifier cell comprising: a main-PA-first-input-terminal, a main-PA-second-input-terminal, and a main-PA-output-terminal corresponding to the first input terminal, the second input terminal, and the output terminal of the power amplifier cell, respectively;
wherein the main-PA-output-terminal is connected to the Doherty-amplifier-output-terminal through a main-transmission-line;
a peak power amplifier cell comprising the power amplifier cell of claim 1, the peak power amplifier cell comprising: a peak-PA-first-input-terminal, a peak-PA-second-input-terminal, and a peak-PA-output-terminal, corresponding to the first input terminal, the second input terminal, and the output terminal of the power amplifier cell, respectively;
wherein the peak-PA-output-terminal is connected to the Doherty-amplifier-output-terminal through the series connection of (i) a peak-transmission-line and (ii) a compensating-transmission-line.

12. The Doherty amplifier of claim 11, wherein a characteristic impedance of the main-transmission line, the peak-transmission line, and the compensating-transmission line substantially corresponds to two times the predefined load parameter at the operational frequency.

13. The Doherty amplifier of claim 11, wherein:
the main-transmission-line has an electrical length at the operational frequency such that a sum of a phase delay of the balun and the phase shift introduced by the main-transmission-line substantially equals 90 degrees;
the peak-transmission-line has an electrical length at the operational frequency such that a sum of a phase delay of the balun and the phase shift introduced by the peak-transmission-line substantially equals 90 degrees;
the compensating-transmission-line has an electrical length at the operational frequency that substantially equals 90 degrees.

14. An integrated circuit comprising the power amplifier cell of claim 1.

15. An integrated circuit comprising the power amplifier circuit of claim 9.

16. An integrated circuit comprising the Doherty amplifier of claim 11.

* * * * *